(12) United States Patent
Machado

(10) Patent No.: US 7,227,365 B2
(45) Date of Patent: Jun. 5, 2007

(54) CONNECTOR INSERTION APPARATUS FOR CONNECTING A TESTING APPARATUS TO A UNIT UNDER TEST

(75) Inventor: John Machado, Folsom, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 191 days.

(21) Appl. No.: 10/975,727

(22) Filed: Oct. 28, 2004

(65) Prior Publication Data

US 2006/0097714 A1    May 11, 2006

(51) Int. Cl.
*G01R 31/02* (2006.01)
(52) U.S. Cl. ........................... 324/537; 324/538
(58) Field of Classification Search .............. 324/538
See application file for complete search history.

(56) References Cited

U.S. PATENT DOCUMENTS

| 6,066,957 | A | 5/2000 | Van Loan et al. |
| 6,257,911 | B1 | 7/2001 | Shelby et al. |
| 6,268,719 | B1 | 7/2001 | Swart |
| 6,316,951 | B1 * | 11/2001 | Chiyoda ............... 324/754 |
| 6,509,752 | B1 | 1/2003 | O'Keeffe et al. |

* cited by examiner

*Primary Examiner*—Vincent Q. Nguyen

(57) ABSTRACT

A device for holding one or more connectors and inserting the connectors into one or more receptacles of a unit for testing. The device comprises a base movable toward the receptacles, a connector holder holding the connectors that is movable with the base and movable relative to the base, and a biasing mechanism disposed relative to the connector holder to bias the connector holder toward the receptacles.

29 Claims, 2 Drawing Sheets

US 7,227,365 B2

CONNECTOR INSERTION APPARATUS FOR CONNECTING A TESTING APPARATUS TO A UNIT UNDER TEST

BACKGROUND OF THE INVENTION

The present invention relates generally to testing and/or manufacturing.

A functional circuit test (FCT) assesses units under test such as printed circuit board assemblies (PCBAs). A common testing approach includes placing the unit within a testing apparatus such as a test fixture and connecting testing circuits to the unit by inserting one or more connectors simultaneously into one or more receptacles. The receptacles may be, for example, disposed within a unit-mounted connector receptacle block. A connector holder retains multiple connectors at a proper spacing so that they can be inserted into the receptacles.

For a typical test fixture, the connector holder is rigidly mounted to a plate that moves forward to engage the connectors with the receptacles and enable the functional test. However, if the connector holder moves too far forward (toward the receptacles), the connectors will be pushed too far into the receptacles (over-insertion), possibly causing damage to the receptacles and/or other parts of the unit. Conversely, if the connector holder moves to a position too far from the receptacles, the connectors do not insert fully into the receptacles (under-insertion). In the latter case, the connectors may not function properly, and the functional test may fail. This is especially problematic if the connector holder is configured to move a set distance, as in automated operation. If the set distance is too great or is insufficient, the above problems may occur.

SUMMARY OF THE INVENTION

Embodiments of the present invention provide a device and/or method for holding one or more connectors and inserting the one or more connectors into receptacles for use in a testing apparatus testing a unit. The unit includes one or more of the receptacles for enabling a connection to the unit. A preferred device comprises a base movable in a direction toward the one or more receptacles, a connector holder holding the one or more connectors that is movable with the base and movable relative to the base, and a biasing mechanism disposed relative to the connector holder for imparting a force to the connector holder to bias the connector holder toward the one or more receptacles. The biasing mechanism allows the base, when the one or more connectors engage the one or more receptacles, to move relative to the one or more connectors to prevent over-insertion of the one or more connectors within the receptacles.

DETAILED DESCRIPTION

Figure 1:
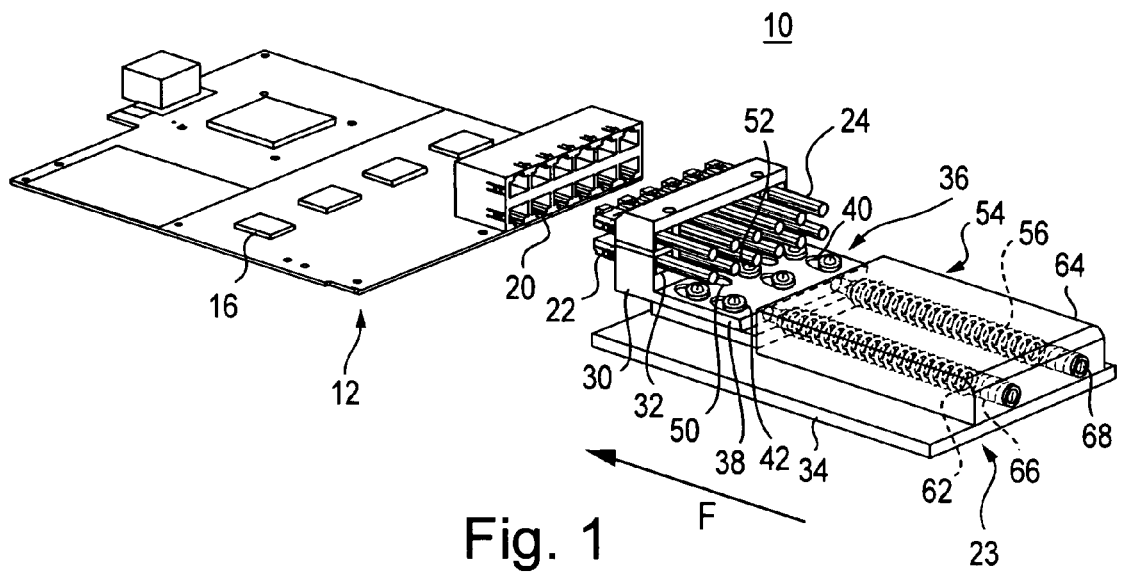
FIG. 1 is a perspective view of a printed circuit board assembly (PCBA) and a portion of a test fixture including connectors in a connector holding mechanism according to a preferred embodiment of the present invention.

Receptacle insertion depths of PCBA-mounted receptacle blocks can vary significantly. One way of accommodating different receptacle blocks with different insertion depths is to readjust the position of the connector holder each time a different PCBA configuration is used. This method has been employed because if the readjustment was not made each time there was a change in PCBA configuration, risks were present for damaging expensive electronic hardware if there was over-insertion of the connectors or false failure in the functional test if there was under-insertion of the connectors. However, this approach adds to the length of time needed to conduct an FCT, and increases costs.

Another way of addressing dimensional variability in PCBA receptacles is to limit the PCBAs that are used. For example, some vendors may be disqualified because they deviate dimensionally from other vendors. In this way, dimensional variability of the receptacle insertion depth is reduced. However, this exposes a production facility to risks from allowing only a limited number of sources for a component, and may be an unacceptable risk in production. Risks include component availability and a lack of price competition. Addressing this can potentially allow more vendors to be considered for qualification testing and production, and thereby allow more options, more competition between vendors, better unit availability, and lower overall costs.

Yet another compensation method is to insert the connectors manually. For example, each connector may be inserted individually into the receptacles, one at a time. However, this may be much slower and more labor-intensive than using an automated method. The increased labor and test time increases the manufacturing cost of the product.

Manual tools also are available for inserting multiple connectors simultaneously. However, the required insertion force for simultaneous multiple connectors is significant, leading to fatigue of an operator using a manual tool, and repetitive use injuries may result if manual connection is employed in a high volume production environment for an extended period of time.

Embodiments of the present invention provide, for a testing apparatus used to perform a functional circuit test of a unit, a connector insertion apparatus inserting connectors into one or more receptacles connected to the unit for conducting a test. The connector insertion apparatus preferably includes a connector holder for holding the connectors, which is movable with a base and movable relative to the base. The base is movable toward the one or more receptacles.

A biasing mechanism is provided for biasing the connector holder toward the receptacles and relative to the base, yet it allows the connectors to cease moving forward with the base after engaging the receptacles. The biasing mechanism may include, for example, a spring, a fluid, a magnetic mechanism, or other mechanism. In an exemplary embodiment, the biasing mechanism includes a spring having a back end pushing against a stop that is rigidly mounted to the base and a forward end imparting a force to the connector toward the receptacles.

In a preferred operation, the unit is placed in the testing apparatus for conducting a functional circuit test (FCT). While the unit remains stationary in the testing apparatus, the connector insertion mechanism including the base and the connector holder moves forward toward the receptacles to engage the connectors with the receptacles. When the connectors in the connector holder bottom out (reach a point where movement is halted or slightly reversed) in the receptacles, the connector holder ceases its forward movement. The base continues moving forward relative to the connector holder. The biasing mechanism imparts a force on the connector holder and biases the connector holder toward the receptacles. However, the biasing mechanism allows the base to move with respect to the connectors after engagement to prevent over-insertion of the connectors. The connector insertion apparatus thus helps retain the connectors at a fully inserted position in the receptacles of the unit, while at the same time it prevents damage to the receptacles or other parts of the unit by reducing or eliminating excessive insertion travel of the connectors into the receptacles.

Figure 2:
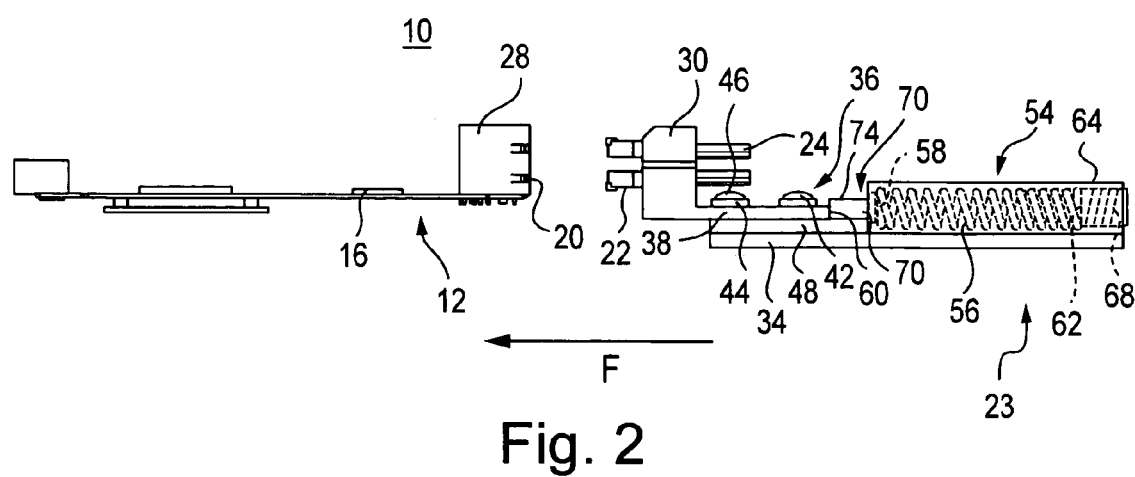
FIG. 2 is a side view of the PCBA and test fixture shown in FIG. 1.
Figure 3:
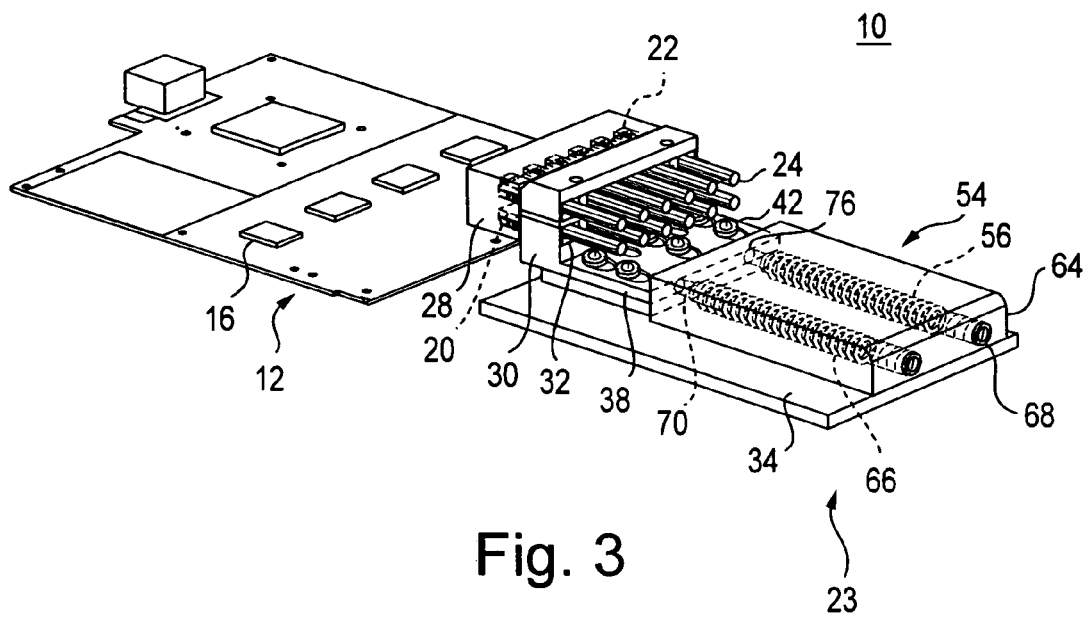
FIG. 3 is a perspective view of the PCBA and test fixture of FIGS. 1 and 2, with the connectors engaged with the PCBA, according to a preferred embodiment of the present invention.
Figure 4:
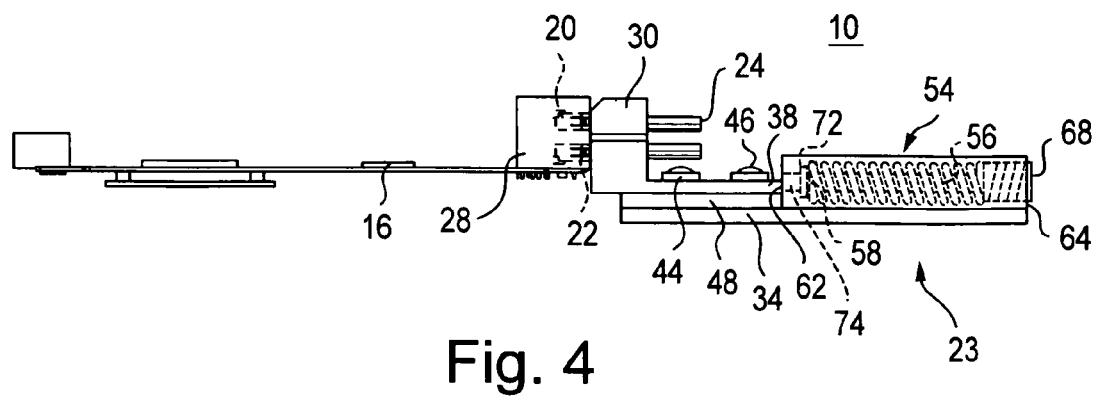
FIG. 4 is a side view of the engaged PCBA and test fixture shown in FIG. 3.

Referring now to the drawings, FIGS. 1 and 2 show a test fixture 10, which is part of an exemplary test apparatus employed for functional testing of a unit under test such as a printed circuit board assembly (PCBA) 12. The PCBA 12 includes components 16 that are tested during the functional test. The test fixture 10 retains the PCBA 12 in a stationary position in a suitable manner, for example, within a holder (not shown). Different configurations of the test fixture 10 are possible, for example, depending on the particular unit that is to be tested.

The PCBA 12 includes one or more receptacles 20 having terminals electrically connected to one or more of the components 16. The receptacles 20 receive electrical connectors 22, as one non-limiting example RJ45 connectors, which are in turn connected via conductive paths such as cables 24 to testing circuits (not shown) for conducting the functional test. During the functional test, signals for testing the components 16 are sent via the cables 24, electrical connectors 22, and the terminals of the receptacles 20, to the components. Feedback signals are returned to the testing circuits, where they are used to evaluate, for example, performance of the PCBA 12.

Preferably, multiple receptacles 20 are arranged in one or more arrays and have a substantially identical depth, measured from front to back along a forward direction F shown in FIGS. 1–2. This provides benefits such as allowing simultaneous engagement with the connectors 22. Also, the receptacles 20 preferably are housed within a suitable housing such as a receptacle housing block (receptacle block) 28, which preferably is perpendicularly mounted to the PCBA 12. The receptacle block 28 preferably has a generally rectangular shape, though the shape can vary.

In an exemplary embodiment, the connectors 22 are held by a connector insertion mechanism 23, which supports the connectors and urges them toward and into the receptacles 20 for engaging the receptacles. The connector insertion mechanism 23 preferably includes a connector holder such as a holder block 30 having individual slots 32. The holder block 30 may be single or multiple pieces, and may be any suitable material or general shape for supporting the connectors 22.

The slots 32 of the holder block 30 preferably are horizontally and vertically aligned with the receptacles 20 in the receptacle housing block 28. Each of the cables 24 preferably extends at least partially through the slots 32. The individual electrical connectors 22 connected to each of the cables 24 extend forward from the holder block 30 facing the receptacles 20 for engaging the receptacles.

A base is provided, which is a structure for moving the connectors 22 toward the receptacles 20. An exemplary base includes a base plate 34, which is movable with the holder block 30, and preferably is connected to the holder block, yet it is movable with respect to the holder block. Preferably, the base, such as base plate 34, supports the holder block 30, as shown in FIG. 1. When the base plate 34 is moved in the forward direction F, as shown in FIGS. 1 and 2, the holder block 30 also moves in the forward direction with the base plate for engaging the electrical connectors 22 with the receptacles 20. However, in other embodiments, the base need not support the connectors 22, nor need it be disposed below the connectors. For example, it is possible that the base may be disposed over the connectors 22, beside the connectors, substantially coplanar with the connectors, or behind the connectors along a linear path so that the connectors are positioned between the base and the receptacle block 20. Therefore, the term "base" as used herein is not to be limited only to a location beneath the connectors 22 or supporting the connectors, directly or indirectly.

For performing the functional test, an actuator (not shown) such as but not limited to a cam assembly of the test fixture 10, moves the base (such as the base plate 34) toward the receptacle block 20 in the forward direction F. Other types of actuators are possible, such as, but not limited to, pneumatic, electrical, or hydraulic actuators. The holder block 30, movable with the base plate 34, moves toward the receptacles 20 and thus moves the electrical connectors 22. Because the electrical connectors 22 and the receptacles 20 preferably are horizontally and vertically aligned, the forward movement of the base plate 34 inserts the electrical connectors into the receptacles.

To allow automated insertion of the connectors 22 into the receptacles, an actuator may be configured to move the connectors, or preferably an apparatus holding the connectors such as the holder block 30, a set distance in the forward direction F. However, because the depth of the receptacles 20 among different PCBAs can vary (for example, variance by manufacturer of the PCBA), if a set distance to be traveled by the electrical connectors 22 is not adjusted relative to insertion of the electrical connectors, a risk of under-insertion or over-insertion may be created. Thus, according to preferred embodiments of the present invention, forward movement of the connectors 22 is automatically adjusted to accommodate varying receptacle depths among different PCBAs.

Because the receptacles 20 in a preferred receptacle block have the same depth, if the electrical connectors 22 each extend substantially the same distance from the holder block 30, the insertion depth of the connectors in such a preferred embodiment can be controlled to accommodate varying depths of the receptacles among various PCBAs by controlling the movement of the holder block. According to a preferred embodiment of the present invention, this is done by controlling the movement of the connectors 22 with respect to the base, and more preferably the movement of the holder block 30 with respect to the base plate 34.

By configuring the holder block 30 to be movable with the base plate 34 yet movable with respect to the base plate, automated connector insertion can be provided by moving the base plate and the holder block toward the receptacle block 28, while compensating for varying receptacle depths by allowing the holder block to move relative to the base plate, and vice versa. Preferably, a sliding mechanism 36 mounted to and movable with the holder block 30 allows the holder block to be slidingly movable with respect to the base plate 34 (and vice versa). An exemplary sliding mechanism 36 includes a sliding plate 38 supporting the holder block 30, which may be integral with or a separate piece (for example, a rigidly mounted piece) from the holder block. In the exemplary embodiment shown, the sliding plate 38 and the holder block 30 (and thus the connectors 22) are supported by the base plate 34. However, it is not always required that the base support the connectors 22, the holder block 30, or a plate such as the sliding plate 38.

For allowing relative movement, the sliding plate 38 may include, for example, elongated slots 40 that extend in the forward direction F. The elongated slots 40 preferably are disposed at one or more locations on a surface of the sliding plate 38. Fasteners such as screws 42 disposed within each of the slots 40 retain a connection of the sliding plate 38 with the base plate 34. This allows the sliding plate 38 to travel with the base plate 34, but also allows relative movement of the sliding plate in the forward and reverse directions along the length of the slots 40.

Preferably, a washer 44 is disposed between a head 46 of each screw 42 to keep the head over the slots 40 and prevent the sliding plate 30 from detaching from the base plate 34. Alternatively or additionally, the diameter of the head 46 can be larger than the width of the slot 40. The washer 44 also provides frictional resistance to the sliding plate 38 to reduce the likelihood of unintentional relative movement between the sliding plate and the base plate 34. Alternatively, a sliding plate may move on one or more tracks, roll on bearings, or slide via other methods or devices.

In the illustrated exemplary embodiment, the base plate 34 is rigidly mounted to a spacer such as an intermediate plate 48 vertically disposed between the base plate and the sliding plate 38, though this may be omitted in other embodiments. The screws 42 are connected to the intermediate plate 48 and/or the base plate 34 for slidingly mounting the sliding plate 38 to the base plate. Additional elongated slots 50 may be provided on the sliding plate 38 to create clearance for fasteners such as screws 52 that rigidly mount the base plate 34 and the intermediate plate 48. Alternatively, the intermediate plate 48 and the base plate 34 may be welded together, integrally formed, or otherwise rigidly connected. By "rigidly", it is intended that the base plate 34 be substantially constrained from movement relative to the intermediate plate 48.

A biasing mechanism 54 is provided that biases the electrical connectors 22 in the forward direction F relative to the base plate 34 while permitting sufficient flexibility of movement to prevent over-insertion. The biasing mechanism 54 thus preferably imparts a controlled force to the electrical connectors 22. The biasing mechanism 54 preferably is movable with the base plate 34, and directly or indirectly biases the sliding plate 38, and thus the holder block 30 and in turn the connectors 22, in the forward direction F. For example, the biasing mechanism 54 may be constrained at one end directly or indirectly by the base (such as base plate 34) or a piece rigidly connected to the base, and the other end may directly or indirectly engage the sliding plate 38 to bias the sliding plate in the forward direction F.

Preferably, the biasing mechanism 54 includes one or more springs 56 disposed so that forward ends 58 of the springs urge the sliding plate 38 forward by biasing a back end 60 of the sliding plate. Back ends 62 of the springs 56 in the exemplary embodiment shown abut a stop that is itself rigidly or adjustably mounted with respect to the base plate 34, so that the extension of the springs biases the sliding plate 38 in the forward direction F. Other types of biasing mechanisms are possible, such as, but not limited to, fluids, extension springs, magnets (repulsion or attraction) etc.

In a preferred embodiment, the springs 56 are disposed in a spring housing block 64 that is rigidly mounted to the base plate 34 directly or indirectly. The spring housing block 64 includes substantially cylindrical passages 66 housing each of the springs 56. The back end 62 of each spring 56 abuts an adjustment mechanism such as a set screw 68, which retains the springs within their respective passages 66 and provides an adjustable stop for the back end. The back end of each passage 66 is preferably threaded for insertion of the set screw 68. Once the position of the set screw 68 is adjusted, it maintains its position with respect to the base plate 34, so that the back end 62 of each spring 56 moves with the base plate 34.

At the opposite end of the springs 56, each of the forward ends 58 preferably biases a piston 70 for engaging the sliding plate 38. A head 72 of each piston 70 abuts the forward end 58. A shaft 74 of the piston 70 extends outwardly from openings 76 at the forward end of each of the passages 66 and abuts the back end 60 of the sliding plate 38. The head 72 preferably has a larger diameter than each opening 76, so that the head is retained within the passage 66, and only the shaft 74 protrudes from the passage. If a fluid is used as the biasing mechanism, it may be, for example, disposed and sealed within a chamber between a stop at a back end and a piston at a front end. If repulsion magnets are used, a magnet (permanent or electromagnet) may be disposed at a back end of a chamber such as within a housing block, while another magnet, slidably movable within the chamber, engages a piston at an opposing end, in turn engaging the sliding plate 38 to bias the connectors 22 in the forward direction F.

By adjusting each set screw 68 in the forward direction F, the springs 56 can be pre-loaded (by compression, for example), thus providing a desired stiffness to the spring and biasing the sliding plate 38 with the electrical connectors 22 in the forward direction with a selectable biasing force. Suitable spring stiffness, for example, retains the connectors 22 within the receptacles 20 when engaged, though too-great stiffness risks damaging the connectors 20 and/or the PCBA 12. This adjustment can be made, for example, before the functional test is conducted. Various lengths or degrees of stiffness for the spring 56 are possible. A longer spring, for example, may allow greater adjustability of stiffness by pre-loading using the set screw 68, but it may lengthen the biasing mechanism 54. If a fluid is used, it may be compressed or expanded as needed to provide a suitable bias. An electromagnet may be set to provide a desired bias as well. The springs 56 may also be pre-loaded without adjustments, by configuration of the springs, the housing block 64, and/or the piston 70, for example.

If the individual receptacles 20 in a single PCBA 12 may vary enough to potentially cause damage to the PCBA or allow under insertion, individual connectors 22, or individual groups of connectors or connector holders may be biased by a suitable biasing mechanism, as opposed to biasing the entire housing block 28 as a single piece. By providing individual springs for connectors, or for groups of connectors or connector holders (e.g., by engaging the connectors 22 directly, or indirectly via a piece rigidly mounted to the connectors), self-adjustment of insertion by connector is possible.

In a preferred operation, after the PCBA 12 is placed and secured as necessary within the test fixture 10, for example by a holder (not shown), the actuator operates to move the base plate 34 of the insertion mechanism 23 in the forward direction F toward the stationary receptacle housing block 28 and the receptacles 20. Alternatively, the base plate 34 can be moved manually, by an operator, for example. Preferably, the base plate 34 travels a set distance along the forward direction F. The sliding plate 38, with the holder block 30 and the electrical connectors 22, move with the base plate 34 until the electrical connectors 22, supported by the holder block 30, enter the receptacles 20 and continue forward.

By adjusting the set screw 68, preferably before operation of the actuator, the springs 56 are pre-loaded a sufficient amount to bias the sliding plate 38 (and indirectly the holding block 30) in the forward direction F. In a preferred embodiment, this spring bias should be sufficient to substantially prevent the sliding plate 38 from sliding with respect to the base plate 34 (and thus from moving away from the receptacle block 28) until the electrical connectors 22 engage the receptacles 20. By biasing the sliding plate 38 in this manner and by moving the base plate 34 a sufficient distance in the forward direction F, this ensures that the connectors 22 are not under-inserted once the base plate 34 has finished moving. If the base is positioned behind the holder block 30 (which may be disposed on a sliding plate, for example), so that the base and sliding block are slidingly movable (e.g., on a track), movement of the base in the forward direction F, with sufficient preloading of the biasing mechanism, will act to push the connectors 22 towards the receptacles 20 so that the connectors and the base move together.

While the base plate 34 is moving, the connectors 22 bottom out inside the receptacles 20, and an electrical connection is made with terminals within the receptacles. On or after bottoming out, the connectors 22 stop moving forward due to resistance from the receptacle housing block 28. The base plate 34, slidingly movable with respect to the sliding plate 38 holding the holder block 30, continues moving in the forward direction F, and relative to the sliding plate, until the base plate has finished moving (e.g., until it has moved the set distance).

The base plate 34 then remains in place during the FCT. If the biasing mechanism includes compressive springs, the relative movement of the sliding plate 38 and the base plate 34 causes the springs 56 to compress, which biases the electrical connectors 22 in the forward direction F to maintain a connection with the receptacles 20. However, the relative movement permitted by the biasing mechanism 54 (e.g. by compression of the springs 56) substantially inhibits or prevents excessive insertion travel into the receptacles 20 of the receptacle housing block 28. Thus, the connectors 22 do not necessarily, or typically, travel the entire distance traveled by the base plate 34 but instead they stop moving forward after bottoming out in the receptacles 20. This prevents damage to the PCBA 12. With the necessary electrical connections being made, the functional test is performed by sending signals from the testing circuits to the PCBA 12 via the connectors 22 and the receptacles 20. Methods for conducting functional circuit tests are known to those skilled in the art.

Those in the art will appreciate that a connector insertion apparatus has been shown and described, preferred embodiments of which include many advantages. The connection insertion apparatus preferably can be implemented into a testing apparatus for inserting connectors into differently-sized receptacle blocks. Positional adjustments to the connectors preferably are not necessary to accommodate PCBA-mounted connector receptacle blocks that have varying connector depths of insertion. The connector insertion apparatus self-adjusts to the specific insertion depth of the receptacle block to reduce or prevent over-insertion of the connectors in the receptacles and the associated damage to the receptacle block, yet it preferably ensures and maintains engagement of the connectors with the receptacles.

While various embodiments of the present invention have been shown and described, it should be understood that other modifications, substitutions, and alternatives are apparent to one of ordinary skill in the art. Such modifications, substitutions, and alternatives can be made without departing from the spirit and scope of the invention, which should be determined from the appended claims.

Various features of the present invention are set forth in the appended claims.

What is claimed is:

1. A device for holding connectors and inserting the connectors into receptacles for use in a testing apparatus testing a unit, the unit including one or more of the receptacles for enabling a connection to the unit, the testing apparatus including one or more of the connectors to connect with the one or more receptacles, said device comprising:
    a base movable in a direction toward the one or more receptacles;
    a connector holder for holding the one or more connectors, said connector holder being movable with the base and movable relative to the base;
    a biasing mechanism disposed relative to said connector holder for imparting a force directly to the connector holder to bias said connector holder toward the one or more receptacles, said biasing mechanism allowing said base, when the one or more connectors engage the one or more receptacles, to move relative to the one or more connectors to prevent over-insertion of the one or more connectors within the one or more receptacles.

2. The device of claim 1 wherein said biasing mechanism is movable with said base.

3. The device of claim 1 wherein said biasing mechanism is constrained at an end, and another end imparts a force to said connector holder.

4. The device of claim 1 wherein said biasing mechanism comprises a spring.

5. The device of claim 4 wherein said spring is constrained at an end by a stop and another end of said spring imparts a force to said connector holder.

6. The device of claim 5 wherein said stop comprises an adjusting mechanism that is rigidly mounted to said base after adjustment, the adjusting mechanism being adjustable to load said spring.

7. The device of claim 6 wherein said biasing mechanism further comprises a block movable with said base and including a passage housing the spring, and wherein the adjusting mechanism comprises a set screw extending into the passage.

8. The device of claim 7 wherein said biasing mechanism further comprises a piston having an end operatively coupled to said connector holder and another end abutting the spring.

9. The device of claim 1 further comprising a sliding mechanism rigidly mounted to said connector holder and slidingly mounted to said base.

10. The device of claim 9 wherein said sliding mechanism comprises a sliding plate slidingly mounted to said base, said connector holder being rigidly mounted to said sliding plate.

11. The device of claim 10 wherein said connector holder comprises a block having slots for receiving and supporting the one or more connectors.

12. The device of claim 1 further comprising:
    an actuator for moving said base.

13. The device of claim 12 wherein said actuator is configured to move said base a set distance.

14. The device of claim 1 wherein said biasing mechanism comprises at least one of a spring, an electromagnet, a permanent magnet and a fluid.

15. A testing apparatus for testing a circuit board having one or more receptacles for electrically connecting the apparatus to components of the circuit board, the apparatus comprising:
a holder for the circuit board;
one or more connectors for engaging with the one or more receptacles and connecting the testing apparatus to the circuit board;
an insertion device for urging said one or more connectors into engagement with the one or more receptacles, said insertion device comprising:
a connector holder supporting said one or more connectors;
a base movable with said connector holder and movable relative to said connector holder;
a biasing mechanism for imparting a force to said connector holder to urge said one or more connectors toward the one or more receptacles, wherein, when said one or more connectors are engaged with the one or more receptacles, said biasing mechanism allows movement of said base relative to said connector holder to prevent over-insertion of said one or more connectors within the one or more receptacles.

16. The apparatus of claim 15 further comprising:
an actuator for moving said base a set distance towards said receptacles.

17. The device of claim 15 wherein said biasing mechanism is constrained at an end by a stop rigidly mounted to said base, and another end of said biasing mechanism imparts a force to said connector holder.

18. The device of claim 17 wherein the stop comprises an adjusting mechanism that is rigidly mounted to said base after adjustment, the adjusting mechanism being adjustable to load said biasing mechanism.

19. The device of claim 15 wherein, when said one or more connectors are engaged with the one or more receptacles, said biasing mechanism allows said base to move relative to said connector holder while said one or more connectors cease moving.

20. The device of claim 15 wherein said insertion device further comprises a sliding mechanism rigidly mounted to said connector holder and slidingly mounted to said base.

21. The device of claim 20 wherein said sliding mechanism comprises a sliding plate slidingly mounted to said base, said connector holder being rigidly mounted to said sliding plate.

22. An apparatus for testing a printed circuit board assembly having one or more receptacles for accepting connectors coupled to testing circuitry, the apparatus comprising:
a holder for retaining the printed circuit board assembly in a stationary position;
an actuator for urging the connectors forward toward the printed circuit board assembly, wherein the connectors at least partially engage the one or more receptacles;
a base plate coupled to the actuator, wherein the base plate moves toward the printed circuit board assembly;
a connector holder slidingly coupled to the base plate, the connector holder supporting the connectors;
a biasing mechanism movable with the base plate and being disposed to impart a force to the connector holder, the biasing mechanism being disposed within a housing rigidly mounted to the base plate;
wherein operation of the actuator moves the base plate and the sliding plate toward the one or more receptacles;
wherein before the base plate has finished moving, the connectors bottom out within the one or more receptacles and cease moving while the base plate continues moving forward.

23. The apparatus of claim 22 wherein said actuator is configured to move said base a set distance.

24. A method of connecting a unit with a testing apparatus for testing the unit, the unit including one or more receptacles for enabling an electrical connection to the unit, the testing apparatus including one or more connectors to connect the one or more receptacles to testing circuits, the method comprising:
pre-loading a biasing mechanism to bias a connector holder in a forward direction, the connector holder supporting the one or more connectors, the connector holder being movable with a base and movable relative to the base;
moving the base toward the one or more receptacles in the forward direction to engage the connectors with the one or more receptacles, wherein the biasing mechanism allows the one or more connectors to cease moving forward as the base continues moving forward, to prevent over-insertion of the one or more connectors within the one or more receptacles and maintain an electrical connection between the one or more connectors and the one or more receptacles.

25. The method of claim 24 wherein the biasing mechanism is constrained at a back end and at a forward end operatively moves the one or more connectors in the forward direction.

26. The method of claim 24 wherein the base moves a preset distance.

27. A device for holding connectors and inserting the connectors into receptacles for use in a testing apparatus retaining and testing a printed circuit board assembly (PCBA), the PCBA having a circuit board and a receptacle block including the receptacles for enabling a connection to the PCBA, the testing apparatus including the connectors to connect with the receptacles, said device comprising:
means for holding the connectors;
means for moving said means for holding, said means for moving being movable in a direction toward the receptacles, said means for holding being movable with said means for moving and movable relative to said means for moving;
means for biasing disposed relative to said means for holding for imparting a force to said means for holding to bias said means for holding toward the receptacles, said means for biasing allowing said means for moving, when the connectors engage the receptacles, to move relative to the connectors to prevent over-insertion of the connectors within the receptacles.

28. The device of claim 27 wherein said means for biasing is constrained at an end, and another end imparts a force to said means for holding.

29. The device of claim 27 wherein said means for biasing further comprises a piston having an end operatively coupled to said means for holding and another end abutting the spring.

* * * * *